United States Patent
Chiu et al.

(10) Patent No.: US 6,771,824 B1
(45) Date of Patent: Aug. 3, 2004

(54) ADAPTIVE VARIABLE LENGTH DECODING METHOD

(75) Inventors: Yi-Jen Chiu, Holmdel, NJ (US); Rajesh Hingorani, Princeton Junction, NJ (US); Obed Duardo, Coral Springs, FL (US); Paul Albin Wilford, Piscataway, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/473,809

(22) Filed: Dec. 28, 1999

(51) Int. Cl.$^7$ .................................................. G06K 9/36
(52) U.S. Cl. ....................................... 382/233; 382/246
(58) Field of Search ................................ 382/233, 232, 382/234, 244–246; 341/67, 65, 79, 51, 106; 375/240.23, 240.25

(56) References Cited

U.S. PATENT DOCUMENTS

| | | | | |
|---|---|---|---|---|
| 4,853,696 A | * | 8/1989 | Mukherjee | 341/65 |
| 5,621,405 A | * | 4/1997 | Park | 341/67 |
| 5,696,507 A | * | 12/1997 | Nam | 341/67 |
| 5,825,314 A | * | 10/1998 | Kawauchi et al. | 341/67 |
| 5,973,626 A | * | 10/1999 | Berger et al. | 341/65 |

OTHER PUBLICATIONS

Bai–Jue Shieh et al., A high–throughput memory based VLC decoder with code boundary prediction, IEEE 1051–8215/00, 1514–1521.*
Chang et al., Designing high throughput VLC decoder, IEEE 1051–8215/92, pp. 187–196.*
Durado et al. An HDTV video coder, IEEE 0098 3063/97, pp. 628–631.*

* cited by examiner

*Primary Examiner*—Leo Boudreau
*Assistant Examiner*—Ishrat Sherali

(57) ABSTRACT

A method is disclosed for decoding multiple-coded symbols from a coded input symbol stream in a single clock cycle. The method constructs an original Huffman look-up table by extending the associated Huffman tree to decode multiple symbols in one clock cycle in a first embodiment and decodes multiple DCT coefficient symbols in an alternate embodiment. An advantage of the method is that the depth of the new Huffman tree is adjustable thereby making the method easily adaptable to various hardware architectures. A further advantage of the present invention is that the decoding process speed is significantly increased while the size of the look-up table is nominally increased.

6 Claims, 4 Drawing Sheets

ADAPTIVE VARIABLE LENGTH DECODING METHOD

BACKGROUND OF THE INVENTION

1. Field of the Invention

This disclosure relates to coding methods and, in particular, to a Huffman decoder.

2. Description of the Related Art

Huffman coding is a variable length coding (VLC) technique for lossless data compression that, unlike the lossy nature of transform based coders, provides for the exact recovery of the original data from its compressed version. Compression is achieved by assigning longer codewords to less frequent input symbols and shorter codewords to the more frequent input symbols. Given the source symbol probability distribution, a Huffman coder achieves optimality; that is, the average length of Huffman code approaches the theoretical minimum, i.e., the entropy of the source, where the entropy of the source is defined as the minimum number of bits needed to encode the entire message with lossless compression.

Due to its simplicity and efficient compression capability, Huffman coding has been widely used in the international standards for Group 3 fax, Group 4 fax, JPEG image compression, and MPEG1/MPEG2 video compression.

Huffman encoders map the input source data into codewords of variable length, concatenate them all together and then segment them into fixed-length words (e.g., 8 bits or 16 bits). Huffman encoding can be implemented via table look-ups, or bit-serial operations by traversing a Huffman tree. The use of table look-ups usually speeds up the encoding process. A Huffman look-up table is built based on the empirical source symbol probability distribution. Due to the different characteristics of the data statistics, different applications may have different Huffman look-up tables.

Huffman decoding presents a set of unique challenges. Since different source symbols have different codeword lengths, the receiver has no knowledge of the boundaries of the consecutive codewords in a bitstream. The receiver usually has to decode the bitstream sequentially, bit-by-bit, by tracing a Huffman tree until a leaf (i.e., a terminating node) is reached. Tracing a Huff-man tree node-by-node is time-consuming. Table look-ups were proposed to speed up the decoding process. Traditional table look-ups allow receivers to decode one symbol at a time. However, it does not provide adequate throughput for very high data rate applications, such as decoding HDTV. See (Obed Duardo, et al. "An HDTV Video Decoder IC for ATV Receivers" *IEEE Transactions on Consumer Electronics.* Vol. 43, number 3, pages 628–632, August, 1997 and S. F Chang and D. G. Messerschmitt. "Designing High-Throughput VLC Decoder Part I—Concurrent VLSI Architectures." *IEEE Transactions on Circuits and systems for Video Technology.* Vol. 2, number 2, pages 187–196, June 1992). Given the proliferation of high data rate applications, the ability to decipher multiple-coded symbols in each clock cycle is desirable for clock speeds typically operated in the range of 15 to 100 Mhz.

SUMMARY OF THE INVENTION

Briefly and in general terms, in a preferred embodiment, the present invention provides a method to enhance the decoding rate of symbols from a coded bitstream. The coded bitstream includes one or more variable length codes (VLCs) produced by a Huffman code.

According to one aspect of the invention, an extended Huffman look-up table is constructed from an original Huffman look-up table wherein the extended Huffman look-up table contains row entries for decoding multiple variable length encoded symbols in a single clock cycle.

According to a second embodiment of the invention, a look-up table is constructed capable of decoding at least N Discrete Cosine Transform (DCT) coefficients in a single clock cycle so as to complete the decoding of an entire DCT block within 64/N+1 clock cycles.

The present invention advantageously improves the decoding rate (i.e., throughput) by extending an original Huffman table from the most frequent symbols while increasing the look-up table size a nominal amount.

A further advantage of the present invention, in accordance with the second embodiment, is that the decoding rate performance is guaranteed. This aspect is desirable from a hardware design perspective in that the method is adaptable to satisfy differing video hardware system requirements simply by adjusting the value of N (i.e., the number of coefficients to be decoded in a single cycle).

BRIEF DESCRIPTION OF THE DRAWINGS

The foregoing features of the present invention will become more readily apparent and may be understood by referring to the following detailed description of an illustrative embodiment of the present invention, taken in conjunction with the accompanying drawings, where.

DETAILED DESCRIPTION OF THE PREFERRED EMBODIMENTS

The present invention seeks to provide a method for enhancing the decoding rate of a variable length Huffman encoded input stream by extending a traditional Huffman tree to allow the decoding of multiple-coded symbols in a single clock cycle, for clock speeds typically operated in the range of 15–100 Mhz. In a second embodiment of the present invention, a method is provided, utilizing the properties of run length coding (RLC), to decode multiple Discrete Cosine Transform (DCT) coefficient symbols in a single clock cycle.

In general, given a symbol set, where each symbol occurs a given number of times in an uncompressed file, the Huffman compression algorithm discovers the symbolic substitution for each original symbol to produce the shortest compressed file. The Huffman algorithm first builds a Frequency Table for each symbol in the uncompressed file (i.e., a message). For example, assuming a message, such as "abdfeeccba . . . cbabcdfcefcab" is derived from an alphabet of six letters, {a,b,c,d,e,f}, an exemplary statistical distribution is shown in Table 1:

TABLE 1

| Symbol | Frequency of Occurrence |
|---|---|
| a | 850 |
| b | 177 |
| c | 171 |
| d | 141 |
| e | 132 |
| f | 810 |

From the frequency table the Huffman algorithm builds a Huffman Tree. The construction of a Huffman tree is well known in the art. See, e.g., Y. J. Chiu, L. Wu, S. Hsieh, P. Wilford. "Fast Algorithms for Huffman Decoding." Technical Memorandum: BL0314100-980615-1TM. Bell Labs, Lucent Technologies, 1998.The purpose of the Huffman tree is to associate each character from the message (i.e., uncompressed file) with a variable length bit string in accordance with its frequency of occurrence. The more frequently used characters get shorter bit strings, while the less frequent characters get longer bit strings.

Figure 1:
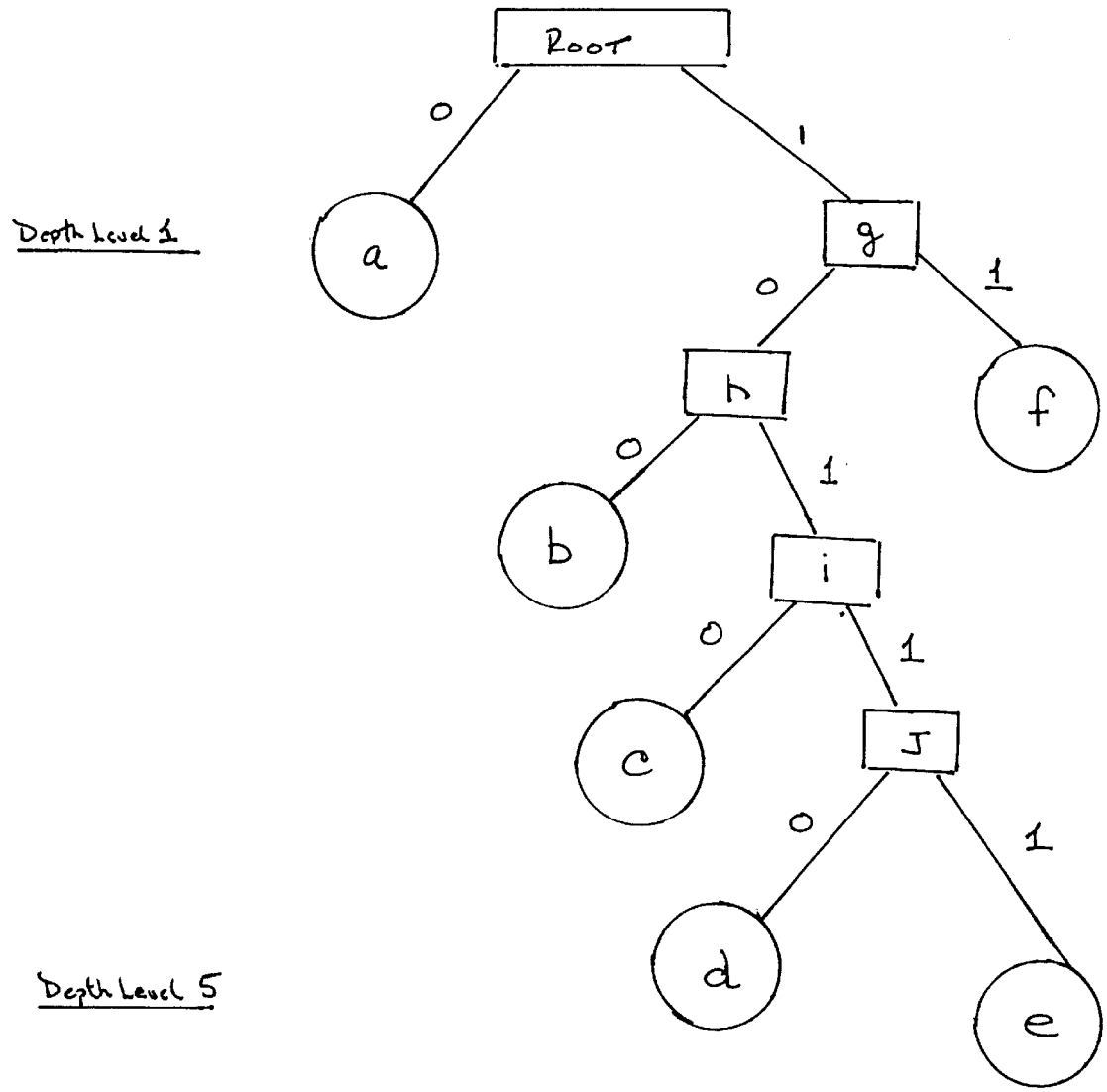
FIG. 1 illustrates a binary Huffman tree according to the prior art.

FIG. 1 is an example of a Huffman tree constructed in accordance with the statistical distribution for the example above. Each of the symbols (i.e., a,b,c,d,e,f) contained in the message function as nodes or leaves in the tree. Each node is assigned a weight, which is the frequency of the symbol's appearance in the message. That is, the depicted Huffman tree maps a set of fixed-length input symbols into a set of corresponding variable length codewords {symbol "a"= codeword 0, b=100, c=1010, d=10110, e=10111, f=11 } based on the occurrence. The identified variable length codewords are used as symbol substitutions to compress the message. The Huffman tree is characterized by parameters including depth level and terminal nodes. The Huffman tree of FIG. 1 has a depth level of 5, and 6 terminal nodes (i.e., leaves) representing each of the characters from the input message {a,b,c,d,e,f}; one terminal node at each level and two terminal nodes in the deepest level, level 5.

The symbols from the input message file are compressed in accordance with the symbol substitution defined by the Huffman tree and transmitted to the destination as a compressed data file. At the destination, a decompression routine reverses the process by reading in the stored frequency table that was used in compressing the file. From the frequency table, the decompressor can then rebuild the Huffman tree, and from that, extrapolate all the bit strings stored in the compressed file to their original character values.

Typically, the frequency table is stored in the header of the compressed file and is extracted therefrom to perform decoding. It is understood that the Huffman tree is a mathematical artifice which is embodied as a look-up table in a practical implementation. The Huffman look-up table corresponding to the Huffman tree for the present example is depicted below as Table 2. As previously described, each symbol is associated with its corresponding variable length codeword. For example, at the first row of the table, symbol "a" maps to a variable length codeword "0", having a length of 1.

TABLE 2

| Input | Symbol | Length (bits) |
|---|---|---|
| 0xxxx | a | 1 |
| 100xx | b | 3 |
| 1010x | c | 4 |
| 10110 | d | 5 |

TABLE 2-continued

| Input | Symbol | Length (bits) |
|---|---|---|
| 10111 | e | 5 |
| 11xxx | f | 2 |

Utilizing the look up table, Huffman decoding is a straightforward process. L bits are simultaneously read into a buffer in each clock cycle. (On the present example, L=5 bits) However, L can be greater than or less than five bits depending upon the requirements of the particular application. The L bits read into the buffer are used as an index into the look-up table to determine a decoded symbol. For example, reading in the exemplary sequence {L=11010}, indexes into the sixth row of Table 2 to decode character "f".

Once a symbol is decoded, the number of bits corresponding to the decoded symbol are purged from the buffer, i.e., the first two bits are purged from the buffer and three additional bits are maintained and left shifted in the buffer to continue the decoding process at the next iteration. That is, only the decoded bits are left shifted out of the buffer and an equivalent number of bits are right shifted into the buffer to process the next five bits from the input message stream. The above steps are repeated until the entire input stream has been processed. It should be noted that although one symbol is decoded per single clock cycle making this process faster than bit-serial decoding, the process does not provide adequate throughput for very high data rate applications, such as decoding HDTV which requires that multiple symbols are decoded in each clock cycle.

As will be described, the method of the present invention provides a solution for resolving (decoding) more than one symbol in a single clock cycle and thereby increases the data decoding rate required for high speed applications.

Figure 2:
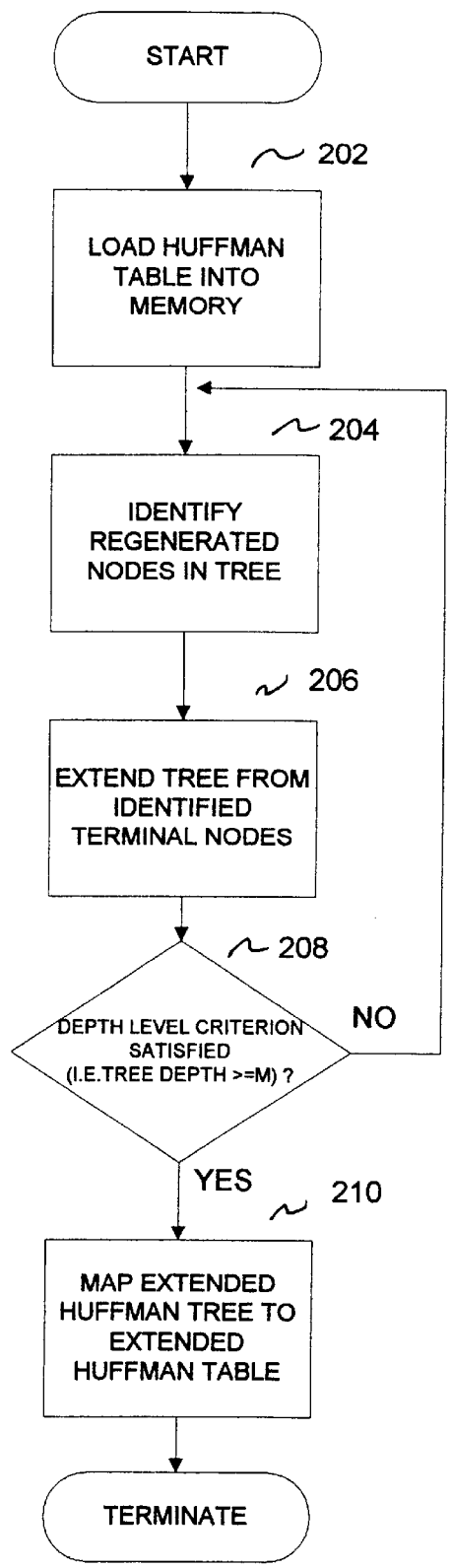
FIG. 2 illustrates a flowchart of the adaptive variable length coding method according to a first embodiment of the present invention.

FIG. 2 is a flow chart illustrating the process steps for selectively extending an original Huffman tree, generated from an original Huffman table, from those terminal nodes having the highest frequency of occurrence, hereinafter referred to as regenerated nodes, to create an extended Huffman tree from which a new Huffman look-up table is mapped. This new Hoffman look-up table includes row entries for decoding multiple encoded symbols in a single clock cycle, according to an embodiment of the present invention.

Referring to FIG. 2, prior to the first substantive step, an original (i.e., non-extended) Huffman tree is mapped from an compressed input file (i.e., a message). At step 202, initialization is performed; a Huffman table corresponding to the original Huffman tree is loaded into a memory buffer. At step 204, identification is performed; those terminal: nodes of the original Huffman tree at the nearest level to the root are identified. These nodes are identified to be regenerated nodes which are nodes from which the original Huffman tree will be extended. For the illustrative example of FIG. 1, the Huffman tree has five levels, terminal node "a" at level 1 represents a regenerated node (i.e., a terminal node at the nearest level to the root). It should be noted that there may be one or more terminal nodes at the nearest level to the root and the Huffman tree will be extended from each of the identified regenerated nodes.

At step 206, extension is performed; the original Huffman tree is extended from the regenerated nodes. The extension step involves selecting a first identified regenerated node and from that node, extending the original Huffman tree where the regenerated node assumes the root position of the extension. This step is illustrated in FIG. 3.

Figure 3:
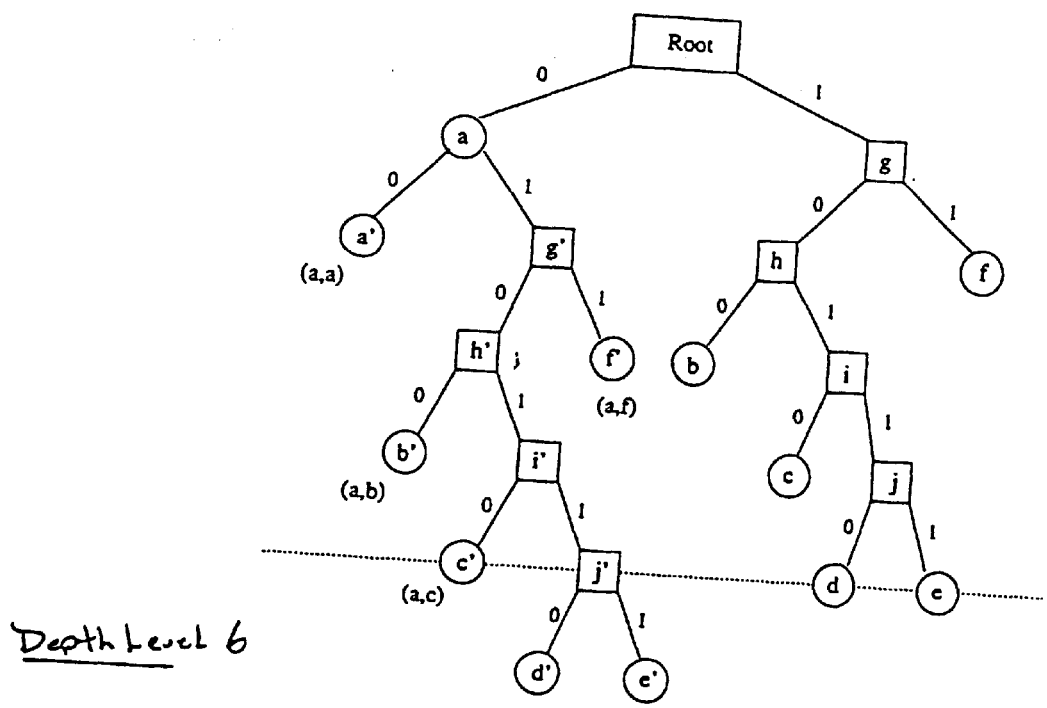
FIG. 3 illustrates an extended Huffman tree according to an embodiment of the present invention.

FIG. 3 illustrates the extended Huffman tree where root node "a" was identified as a regenerated node at the identification step from which the extension or growth will occur. FIG. 3 also illustrates the expanded Huffman tree after a first depth growth where first depth growth is defined as the extended Huffman tree after a first iteration. After each successive iteration it is determined whether a specified maximum depth level M has been met or exceeded. In the present example, after a first depth growth, the extended tree contains six depth levels. M was chosen to be equal to 5 in the present example. That is, M is predetermined. In this case, the extension process will be terminated after a first Iteration of the algorithm. Termination occurs because the depth level of the extended Huffman tree is six after a first depth growth which exceeds the specified value of M=5. In the present example, if M were chosen to be larger than six then additional iterations would be required until the extended Huffman tree meets or exceeds the value specified for M. Once the tree has been extended to meet or exceed the stipulated value of M, a mapping step follows. Step 208 is a decision step to determine whether the depth level of the extended tree exceeds the user specified value of M, the maximum depth level. If not, the process returns to step 204, otherwise the process continues at the mapping step, step 210. At step 210, the final extended tree is then mapped into a new Huffman look-up table, as shown below In Table 3. The mapping is performed via translation procedures well known In the art, however, an additional column Is included in the extended table to Identify the number of decoded symbols capable of being decoded in a single clock cycle for each codeword.

TABLE 3

| Input | Symbol | Length (bits) | Number of Symbols |
|---|---|---|---|
| 00xxx | a,a | 2 | 2 |
| 0100x | a,b | 4 | 2 |
| 01010 | a,c | 5 | 2 |
| 01011 | a | 1 | 1 |
| 011xx | a,f | 3 | 2 |
| 1010x | b | 3 | 1 |
| 10110 | C | 4 | 1 |
| 10110 | d | 5 | 1 |
| 10111 | e | 5 | 1 |
| 11xxx | f | 2 | 1 |

Row entries 1, 2, 3 and 5 of Table 3 illustrate that multiple encoded symbols can be decode in a single clock cycle. Row entries 1, 2, 3, and 5 represent the improved decoding capability which can only be realized in the extended table in accordance with the first embodiment. In particular, it is shown at rows 1, 2, 3 and 5 that respective source symbol pairs (a,a) (a,b) (a,c) and (a,f) may be decoded in a single clock cycle utilizing the extended table.

In sum, the method improves the decoding throughput by extending the Huffman table from the most likely (frequently used) symbols to decode multiple symbols in a single clock cycle. The method provides an average decoding capability of M-1 bits per clock cycle when the maximum allowable depth level M is applied. Advantageously, the size of the original Huffman table is increased by a nominal amount.

Figure 4:
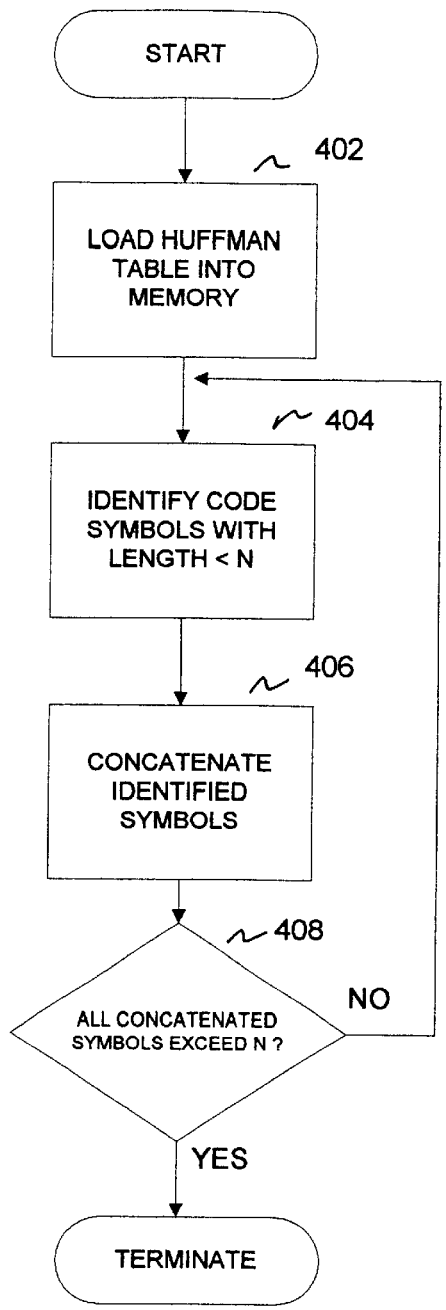
FIG. 4 illustrates a flowchart of the adaptive variable length coding method according to a second embodiment of the present invention.

Referring now to FIG. 4 another embodiment of the present invention is shown for improving the decoding rate of a compressed video signal. It is well known that a substantial amount of data must be transmitted in any digital television system, such as HDTV. In order to most efficiently use the available radio frequency spectrum, it is advantageous to compress the digital television signal to minimize the amount of data that must be transmitted. Video compression techniques enable the efficient transmission of digital video signals over conventional communication channels. As is well known, one of the most effective and frequently used classes of algorithms for video compression is referred to as transform coders. In such systems, blocks of video are transformed into a new domain with properties significantly different from the image intensity domain.

In the case where the blocks are non-overlapping, it is referred to as the discrete cosine transform (DCT). The DCT transform concentrates the energy of the input waveform into a relatively small number of transform coefficients, both DC and AC. The DCT transform typically produces coefficients with amplitudes that are representative of the energy in a particular band of the frequency spectrum. The output of the DCT is a matrix of coefficients which represent energy in the two-dimensional frequency domain. If the coefficients are scanned in a zig-zag manner, starting in the upper left corner, the resultant sequence will contain long strings of zeroes especially towards the end of the sequence. So to convert an 8-by-8 block of pixels into a set of DCT coefficients in the frequency domain, there will be generated one DC coefficient and 63 AC coefficients. Each of the 64 coefficients are quantized resulting in most of the AC coefficients becoming zero and only the non-zero coefficients requiring coding.

In accordance with the method of the present invention, each non-zero, coefficient after quantization is coded using a run-level symbol structure, where "run" refers to the number of consecutive zero AC coefficients; level refers to the magnitude of the quantized AC non-zero coefficients. In video, a run-level symbol with a run length value k means that there are k-zero value AC coefficients and one non-zero coefficient associated with the particular symbol. Thus, in video applications, symbols are decoded by indirect means, namely, through their constituent k+1 DCT coefficients in run-level symbol structure. It will be demonstrated that, in accordance with the present embodiment, the principles of run length coding (RLC) are utilized to exploit the characteristic zero run lengths of DCT coefficients to efficiently decode multiple DCT symbols in a single clock cycle.

Table 4 is an exemplary Huffman look-up table constructed in accordance with the prior art and extended by a fourth column labeled "DCT length" which describes each symbol's computed DCT length (i.e., the number of DCT coefficients required to represent the symbol).

TABLE 4

| Input | Symbol | Run Length | DCT length |
|---|---|---|---|
| 0xxxx | a | 0 | 1 |
| 100xx | b | 1 | 2 |
| 1010x | c | 2 | 3 |
| 10110 | d | 3 | 4 |
| 10111 | e | 4 | 5 |
| 11xxx | f | 1 | 2 |

For example, the third row of Table 4, illustrates that source symbol "c" is represented by input codeword "1010x", having a DCT coefficient length of 3. As previously described, the DCT length of 3 represents the total number of DCT coefficients which define an equivalent transformed representation of the symbol "c" in the frequency domain. Specifically, the symbol "c" has a DCT length equal to (k+1=3) where the run length equals 2 (i.e., the number of consecutive zero AC coefficients). The DCT length column is required to determine when to terminate the decoding process. That is, some minimum number of DCT coefficients, N, will be specified to be decoded in a single clock cycle. That is, N is predetermined.; The DCT length column of the extended table provides an indication after each iteration of the algorithm as to whether this criterion has been satisfied.

Referring collectively to FIG. 4 and Table 5 below, this embodiment of extending an original Huffman look-up table for decode multiple DCT coefficients in a single clock cycle will now be described in greater detail. Referring initially to FIG. 4, prior to the first substantive step an original Huffman table is generated and a fourth column is created and appended to the table, defining the DCT lengths of the respective symbols. At step 402, initialization is performed; the original Huffman table with the additional column is loaded into a memory buffer. At step 404, identification as performed; those code symbols in the buffer are identified, $a_p$ whose corresponding DCT lengths, $l_i$, are less than a predefined minimum decodable, number, N. In the present example, N=3, therefore symbols a,b, and f are identified as symbols having DCT lengths less than the minimum decodable number N=3. The DCT lengths of the identified symbols being less than N are a=1, b=2, and f=2, respectively. These identified symbols will be selected to extend the original Huffman table. At step 406, concatenation is performed; the identified symbols, $a_i$, are connected to every symbol, $b_j$, with length, $l_j$, in the original Huffman look-up table, such that $l_i+l_j<2*N$. For example, it is shown in Table 5 that symbol "a" is concatenated with itself having a combined DCT length of 2. It is also shown that symbol "a" is concatenated with symbol "b" having a combined DCT length of 3. It should be noted, however, that symbol "a" and symbol "e" are not concatenated because their combined DCT length,(l+5) exceeds 5.

The new concatenated symbols are added to the table with DCT lengths of $l_i+l_j$. Step 408 is a determination step to determine whether all newly created concatenated symbols contain a depth level exceeding the user specified value of N. If not, the process returns to step 404 to perform an additional iteration, otherwise the process terminates.

Table 5 below illustrates the extended Huffman table after a single iteration. Further, the table only lists the newly created symbol pairs for clarity. It should be noted, however, that the table includes both new and original symbols for the purpose of decoding.

TABLE 5

| Input | New Symbols | DCT length |
|---|---|---|
| 00xxxxx | a,a | 2 |
| 0100xxx | a,b | 3 |
| 01010xx | a,c | 4 |
| 010110x | a,d | 5 |
| 011xxxx | a,f | 3 |
| 1000xxx | b,a | 3 |
| 100100x | b,b | 4 |
| 1001010 | b,c | 5 |
| 10011xx | b,f | 4 |
| 110xxxx | f,a | 3 |
| 11100xx | f,b | 4 |
| 111010x | f,c | 5 |
| 1111xxx | f,f | 4 |

If a successive (second) iteration of the algorithm were performed, Table 6 below illustrates the extended table at the completion of the second iteration. Table 6 illustrates that the majority of row entries are capable of decoding at least three DCT coefficients at a time.

TABLE 6

| Input | Symbol | DCT length |
|---|---|---|
| 000xxxx | a,a,a | 3 |
| 00100xx | a,a,b | 4 |
| 001010x | a,a,c | 5 |
| 0011xxx | a,a,f | 4 |
| 0100xxx | a,b | 3 |

TABLE 6-continued

| Input | Symbol | DCT length |
|---|---|---|
| 0100xxx | a,c | 4 |
| 01010xx | a,d | 5 |
| 011xxxx | a,f | 3 |
| 1000xxx | b,a | 3 |
| 100100x | b,b | 4 |
| 1001010 | b,c | 5 |
| 10011xx | b,f | 4 |
| 110xxxx | f,a | 3 |
| 11100xx | f,b | 4 |
| 111010x | f,c | 5 |
| 1111xxx | f,f | 4 |
| 1010xxx | c | 3 |
| 10111xx | d | 4 |
| 10111xx | e | 5 |
| 00xxxxx | a,a | 2 |
| 0xxxxxx | a | 1 |
| 100xxxx | b | 2 |
| 11xxxxx | f | 2 |

The bottom part of the table are codewords which cannot be decoded from the upper part codewords. These codewords, however, are rare in occurrence in that they are located at the tail part of the DCT block in zig-zag order.

While the invention is susceptible to various modifications and alternative forms, specific embodiments thereof have been shown by way of example in the drawings and have been described herein in detail with reference to Tables 1–6 and the drawings. It should be understood, however, that it is not intended to limit the invention to the particular forms disclosed, but on the contrary, the intention is to cover all modifications, equivalents and alternatives falling within the spirit and scope of the invention as defined by the appended claims.

What is claimed is:

1. A method for generating an extended Huffman look-up table for use in decoding a compressed signal, said compressed signal including a plurality of coded symbols, said method comprising the steps of;

(a) mapping a Huffman tree from an original Huffman look-up table, wherein said original Huffman look-up table corresponds to coded symbols of said compressed signal;

(b) identifying terminal nodes in a nearest level to a root node in the Huffman tree;

(c) extending the original Huffman tree from the identified terminal nodes to construct an extended Huffman tree; and (d) repeating steps (b) and (c) until a maximum depth level M is reached in the extended Huffman tree.

2. The method as defined in claim 1, wherein the method is performed at a clock speed between 15 and 100 Mhz.

3. The method as defined in claim 1, further comprising mapping the extended Huffman tree to said extended Huffman look-up table.

4. The method as defined In claim 1, wherein the extending step comprises the step of appending the original Huffman tree to at least one identified terminal node of the original Huffman tree.

5. The method as defined in claim 1, wherein the maximum depth level M is predetermined and M−1 defines the average number of bits per clock cycle to be decoded.

6. The method as defined in claim 1, wherein the extended Huffman look-up table contains at least one row entry for decoding at least two encoded symbols in a single clock cycle.

* * * * *